(12) United States Patent
Chen et al.

(10) Patent No.: US 6,432,734 B1
(45) Date of Patent: Aug. 13, 2002

(54) METHOD OF MANUFACTURING A DISPLAY UNIT OF A FLAT DISPLAY PANEL HAVING A WIDE VIEWING ANGLE

(75) Inventors: Chien-Chih Chen; Chih-Hong Chen, both of Hsinchu Hsien; Ya-Hsiang Tai, Hsinchu, all of (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 09/848,257

(22) Filed: May 4, 2001

(30) Foreign Application Priority Data

Dec. 27, 2000 (TW) ........................................ 089128028 A (51) Int. Cl.[7] ........................... H01L 29/00; G02F 1/136
(52) U.S. Cl. ............................................ 438/30; 438/34
(58) Field of Search .............................. 438/30, 34–35, 438/69–70, 22–24, 149

(56) References Cited

U.S. PATENT DOCUMENTS 5,994,721 A * 11/1999 Zhong et al. ................ 257/440
6,320,226 B1 * 11/2001 Gu et al. ..................... 257/347

* cited by examiner

*Primary Examiner*—Jey Tsai
(74) *Attorney, Agent, or Firm*—Birch, Stewart, Kolasch & Birch, LLP (57) ABSTRACT

The present invention discloses a method of manufacturing a display unit of a flat display panel having a wide viewing angle. Conventional process, which requires two mask steps for opening contact holes in isolation layers, is improved and merged into only one mask step, whereby the number of masks is reduced from seven to six in fabricating a pixel unit of a FOP LCD panel and the cost of fabrication is also reduced.

5 Claims, 9 Drawing Sheets

METHOD OF MANUFACTURING A DISPLAY UNIT OF A FLAT DISPLAY PANEL HAVING A WIDE VIEWING ANGLE

BACKGROUND OF THE INVENTION

1. Field of the Invention

The present invention relates to a method, of manufacturing a display unit of a flat display panel having a wide viewing angle, to reduce the required masks in the fabrication process.

2. Description of the Related Art

Liquid crystal display panels (hereinafter referred to as LCD panels) are among the most popular-flat display panels. Recently, LCD panels of the fringe field switch (FFS) type have been developed. Generally a display unit (or pixel unit) in a LCD panel of the FFS type has pixel electrodes and common electrodes, which are made of transparent indium-tin oxide layers (hereinafter referred to as ITO layers) thereby increasing the brightness of the LCD panel. The pixel electrodes of the display unit in the FFS-type LCD panel are formed in a comb shape or a multi-finger shape and the common electrodes of the FFS-type LCD panel are formed in a plate shape. In addition, pixel electrodes of comb shape or multi-finger shape generally are provided over the common electrodes.

The electrode structure of a display unit in an FFS-type LCD panel is prevalent in fabricating a LCD panel having a wide viewing angle. The LCD panel having a wide viewing angle, for instance the IPS (in-plane switch) LCD panel or FOP (finger-on-panel) LCD panel, has a similar electrode structure to that of the FFS-type LCD panel.

The electrode structure of the FOP LCD panel requires two fabricating processes for ITO layers, therefore increasing the number of masks and the manufacturing cost.

FIGS. 1A to 1G show, in a cross-sectional view, the process of fabricating a pixel unit of a FOP LCD panel having a wide viewing angle in a conventional art.

Figure 1A:
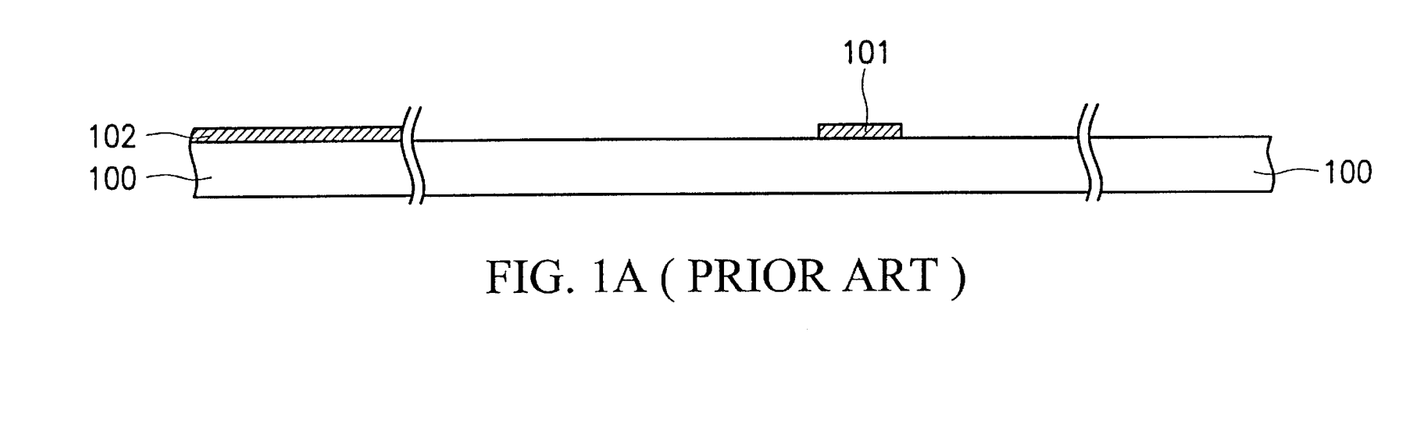
FIGS. 1A to 1G show, in a cross-sectional view, the process of fabricating a pixel unit of a FOP LCD panel having a wide viewing angle in a conventional art.

First, a first metal layer (M1) is formed on a substrate 100, for example, a glass substrate. Secondly, a first photolithography process (using the first mask) is carried out to pattern and then etch the first metal layer (M1) to form a gate layer 101 and a bottom electrode layer 102 on the substrate 100, as depicted in FIG. 1A.

Figure 1B:
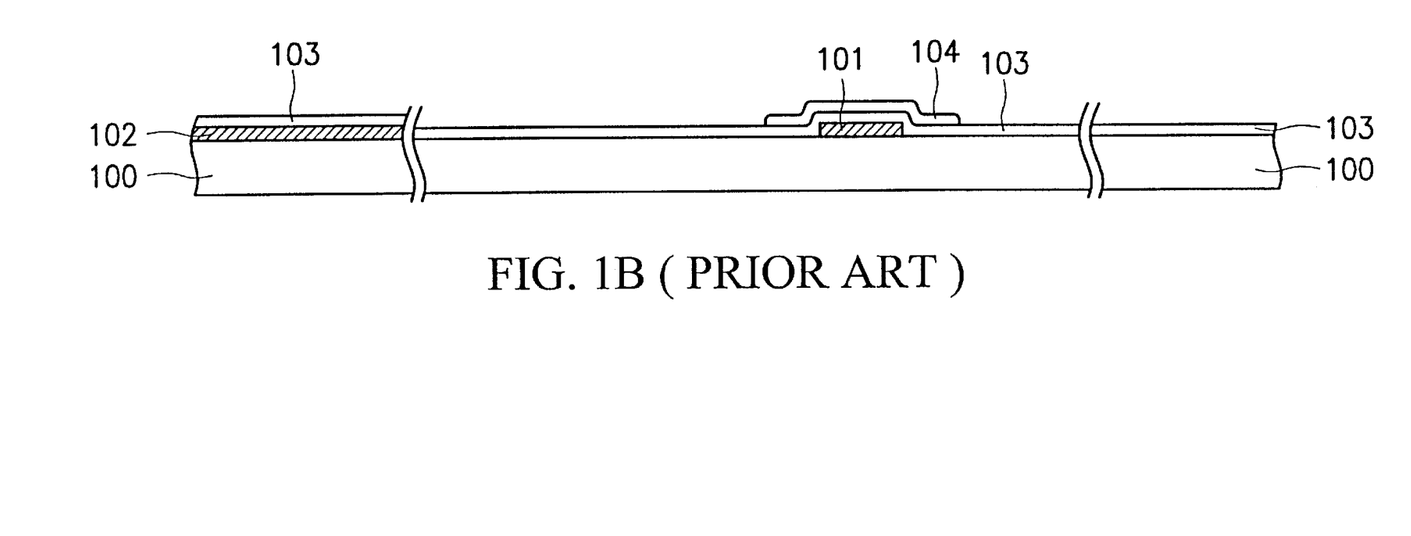

A first isolation layer 103 is formed over the substrate 100. Then, an active layer is formed on the first isolation layer 103. The active layer, for example, is an amorphous silicon layer or a polysilicon layer.

A second photolithography process (using the second mask) is carried out to pattern and then etch the active layer to form an island-like layer 104 overlaying the gate layer 101, as depicted in FIG. 1B.

Figure 1C:
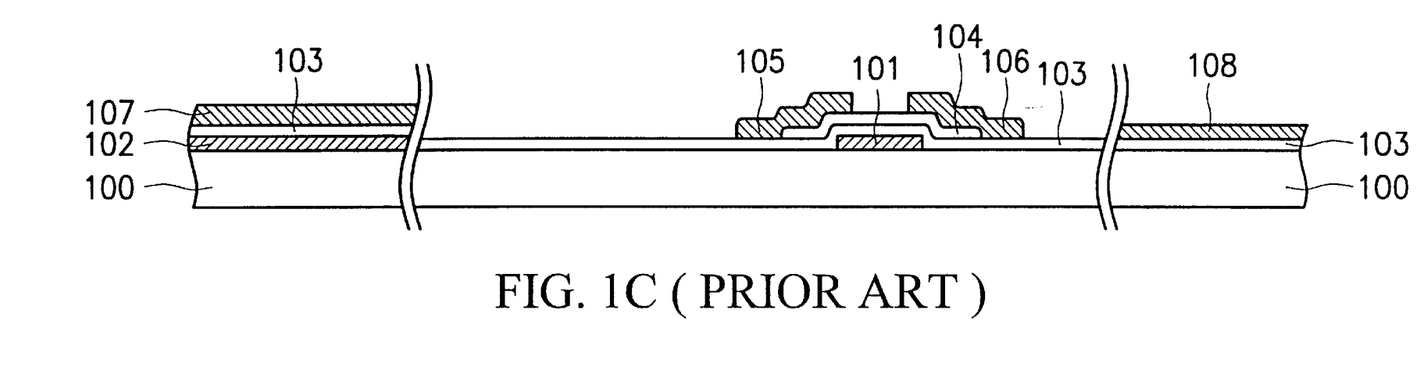

Then, a second metal layer (M2) is formed over the substrate 100.

A third-photolithography process (using the third mask) is carried out to pattern and then etch the second metal layer (M2) to form a first source/drain electrode 105, a second source/drain electrode 106, a top electrode layer 107, and a common contact layer 108, as depicted in FIG. 1C.

It is noted that the first and second source/drain electrodes (105, 106) respectively overlap side portions of the island-like layer 104 and the island-like layer 104 is revealed between the first and second source/drain electrodes (105, 106). The bottom electrode layer 102, the top electrode layer 107, and the first isolation layer 103 constitute a storage capacitor of the pixel unit in the FOP LCD panel.

Figure 1D:
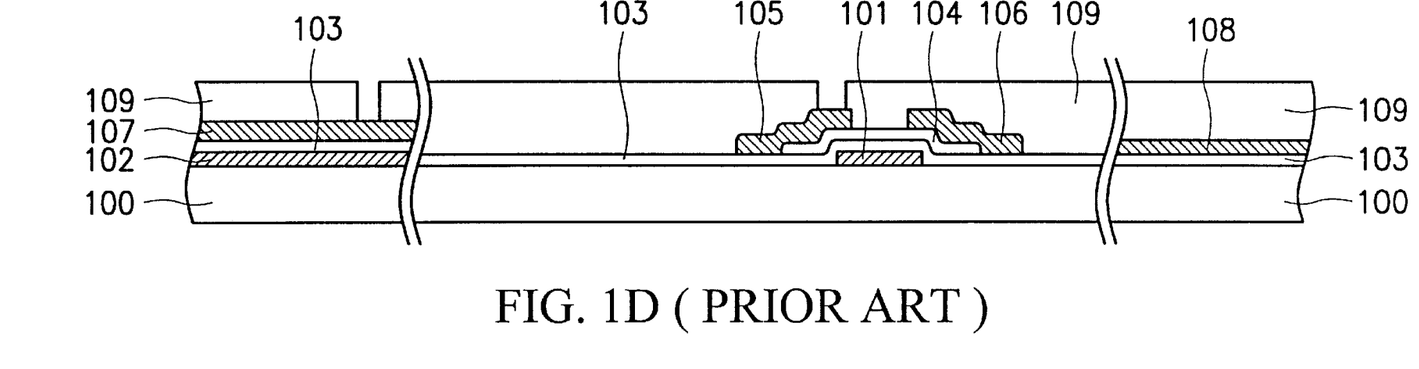

A second isolation layer (referred to as a planarization layer) 109 is then formed over the substrate 100.

A fourth photolithography process (using the fourth mask) is further carried out to pattern and then etch the second isolation layer 109 to reveal the first source/drain electrode 105 and the top electrode layer 107, as depicted in FIG. 1D.

Figure 1E:
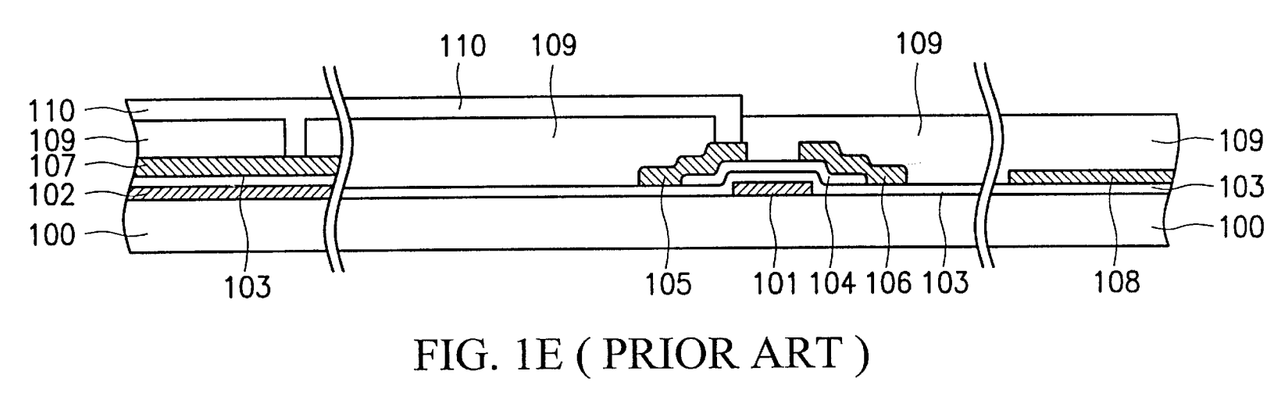

Next, a first ITO layer is formed on the second isolation layer 109.

A fifth photolithography process (using the fifth mask) is carried out to pattern and then etch the first ITO layer so as to form a common electrode layer 110, as depicted in FIG. 1E. The common electrode layer 110 is electrically connected to both the first source/drain electrode 105 and the top electrode layer 107.

Figure 1F:
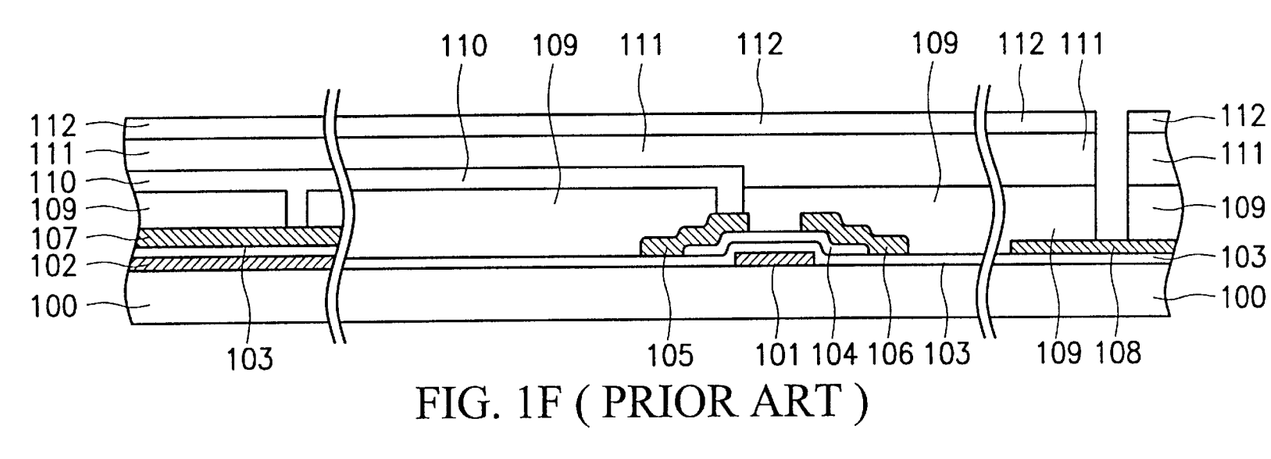

Next, a planarized isolation layer 111 and a TEOS layer 112 are sequentially formed over the substrate 100. Then, a sixth photolithography process (using the sixth mask) is carried out to pattern and then etch the TEOS layer 112 and the planarized isolation layer 111 so as to reveal the common contact layer 108, as depicted in FIG. 1F.

Figure 1G:
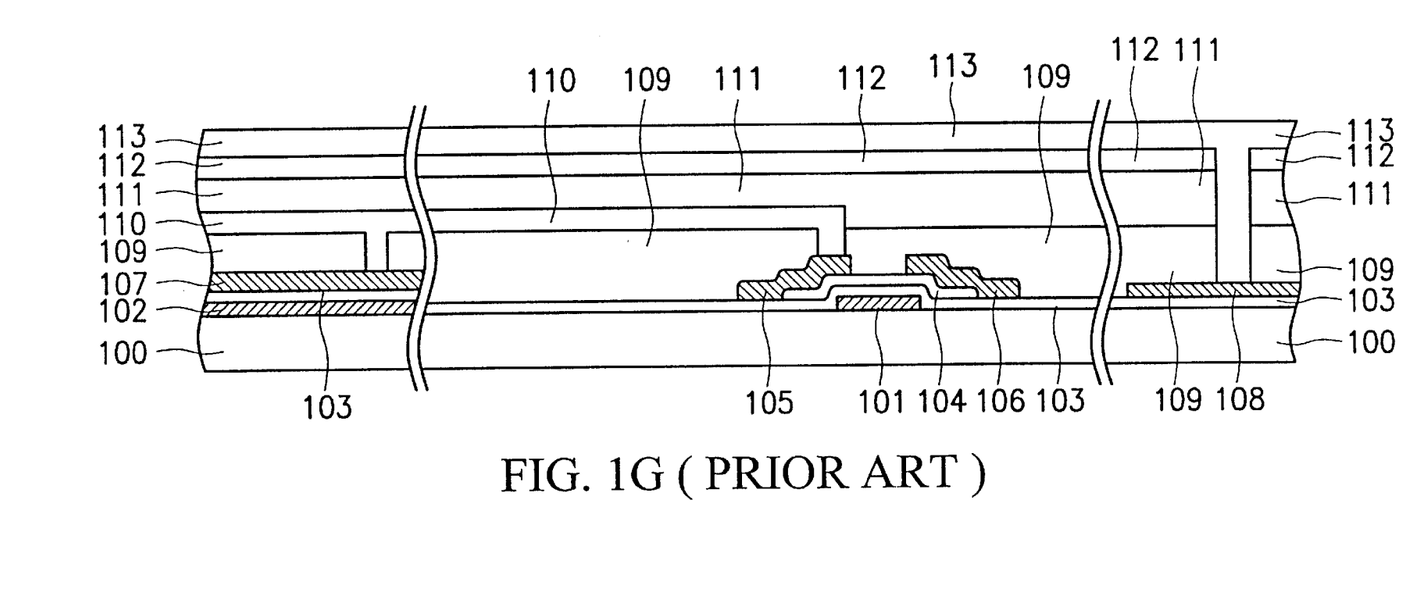

A second ITO layer is formed on the TEOS layer 112. A seventh photolithography process (using the seventh mask) is carried out to pattern and then etch the second ITO layer so as to form pixel electrodes, as depicted in FIG. 1G. The pixel electrodes form in a multi-finger shape or a comb shape.

It is obvious from the above descriptions that seven masks are required to fabricate a display unit of a FOP LCD panel. Seven masks are more than that required to fabricate the FFS-type TFT LCD panel and more costly.

SUMMARY OF THE INVENTION

Therefore, an object of the present invention is to provide a method of manufacturing a display unit of a flat display panel having a wide viewing angle while reducing the number of masks and the cost of fabrication.

The present invention achieves the above-indicated objects by providing a method comprising the following steps.

(a) Form a first conduction layer on a substrate.

(b) Pattern and etch the first conduction layer to form a gate layer and a bottom electrode layer on the substrate.

(c) Form a first isolation layer on the substrate.

(d) Form an active layer on the first isolation.

(e) Pattern and etch the active layer to form an island-like layer over the gate layer.

(f) Form a second conduction layer over the substrate.

(g) Pattern and etch the second conduction layer to form a first and second source/drain electrodes, a top electrode layer, and a common contact layer. It is noted that the first and second source/drain electrodes respectively overlap side portions of the island-like layer revealing the island-like layer therebetween, and the bottom electrode layer, the first isolation layer, and the top electrode layer constitute a storage capacitor of the displaying unit of the flat display panel.

(h) Form a second isolation layer over the substrate.

(i) Form a third conduction layer on the second isolation layer.

(j) Pattern and etch the third and second isolation layers to form a first contact hole, a second contact hole, a third contact hole, a fourth contact hole, and at least a fifth contact hole. It is noted that the first source/drain electrode is revealed in the first contact hole, the common electrode layer is revealed in the second and third contact holes, the top electrode layer is revealed in the fourth contact hole, and the common contact layer is revealed in the fifth contact hole.

(k) Form a third isolation layer over the substrate.

(l) Pattern and etch the third and second isolation layers to form a first contact hole, a second contact hole, a third contact hole, a fourth contact hole, and at least a fifth contact hole. It is noted that the first source/drain electrode is revealed in the first contact hole, the common electrode layer is revealed in the second and third contact holes, the top electrode layer is revealed in the fourth contact hole, and the common contact layer is revealed in the fifth contact hole.

(m) Form a fourth conduction layer on the third isolation layer and respectively fill in the first to fifth contact holes.

(n) Pattern and etch the fourth conduction layer to form a plurality of pixel electrodes, a first connecting layer, and a second connecting layer on the third isolation layer. It is noted that the first source/drain electrode in the, first contact hole and the common electrode layer in the second contact hole are electrically connected via the first connecting layer, the common electrode layer in the third contact hole and the top electrode layer in the fourth contact hole are electrically connected via the second connecting layer, and the pixel electrodes electrically connect to the common contact layer through the fifth contact hole.

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION OF THE PREFERRED EMBODIMENTS

Figure 2:
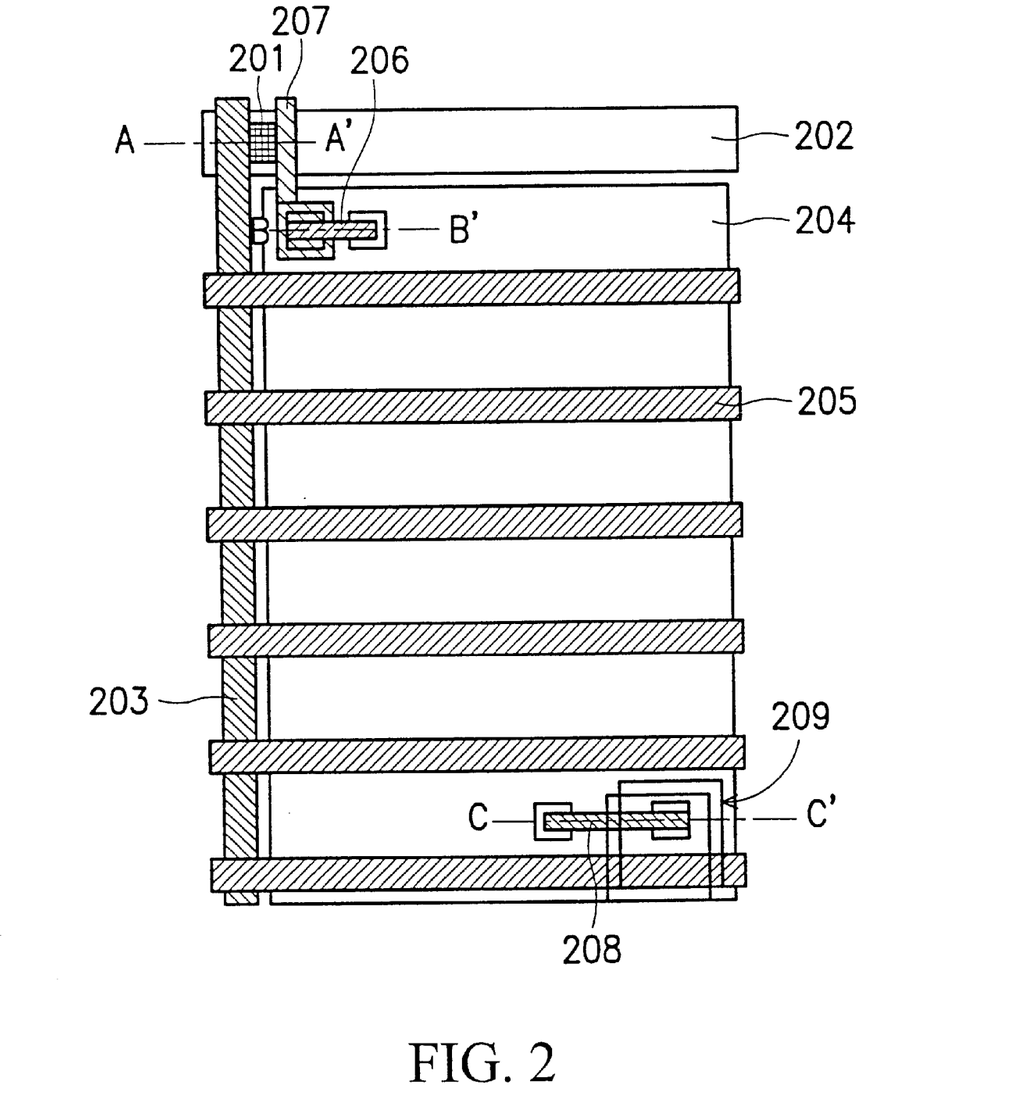
FIG. 2 shows the layout of a pixel unit in a TFT LCD panel manufactured according to the present invention.

FIG. 2 shows the layout of a pixel unit in a TFT LCD panel manufactured according to the present invention. Referring to FIG. 2, a thin film transistor (TFT) 201 serving as a switching device is disposed near the cross section of a scanning line 202 and a data line 203 in the pixel unit. A common electrode layer 204 at the bottom of the pixel unit is in the shape of a plate. A plurality of pixel electrodes 205 at the top of the pixel unit are in the shape of a comb or fingers. The pixel electrodes 205 are mutually disposed in parallel, and electrically connected together via at least a common contact (not shown in FIG. 2). The common electrode layer 204 electrically connects to the first source/drain electrode 207 of the TFT 201 via a first connecting portion 206. The top electrode of a storage capacitor 209 electrically connects to the common electrode layer 204 via a second connecting portion 208.

FIGS. 3A to 3F show the fabricating process of the pixel unit of the LCD panel (FIG. 2) according to a preferred embodiment of the present invention. In FIGS. 3A to 3F, the region I shows a cross sectional view of the TFT 201 taken along line A–A' in FIG. 2; the region II shows a cross sectional view of the electrode structure taken along line B–B' in FIG. 2; the region III shows a cross sectional view of the storage capacitor 209 taken along line C–C' in FIG. 2; and the region IV shows the region forming the common contact (not shown in FIG. 2) in a cross sectional view.

The method of fabricating the pixel unit of the LCD panel in FIG. 2 comprises the following steps.

Figure 3A:
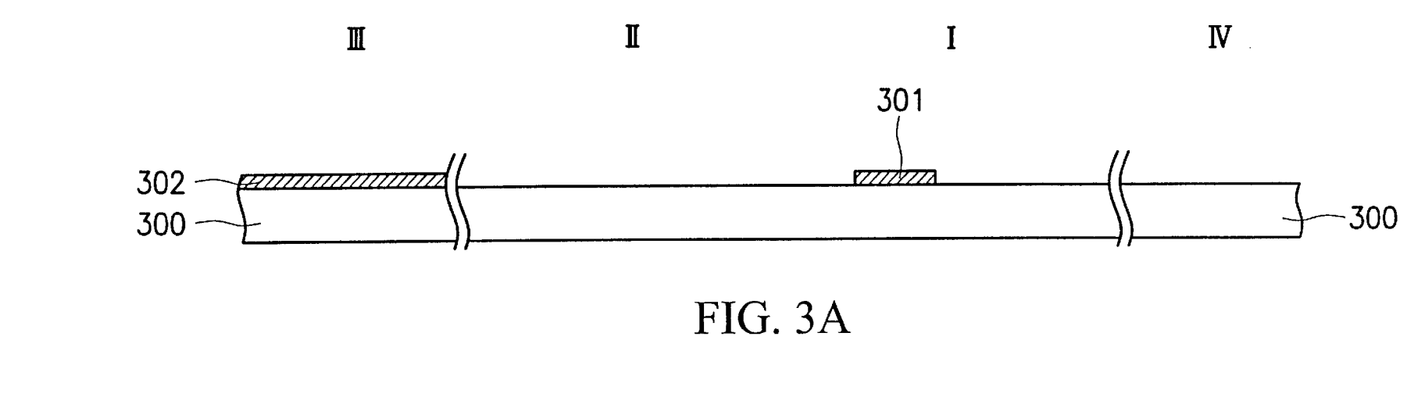
FIGS. 3A to 3F show the fabricating process of the pixel unit of the LCD panel (FIG. 2) according to a preferred embodiment of the present invention.

First, form a first conduction layer, for example a first metal layer (metal-1), on a substrate 300. The substrate is a glass substrate or a quartz substrate.

Carry out the first photolithography process (using the first mask) to pattern and etch the first metal layer (metal-1), thereby forming a gate layer 301 and a bottom electrode layer 302 on the substrate 300, as depicted in FIG. 3A.

Figure 3B:
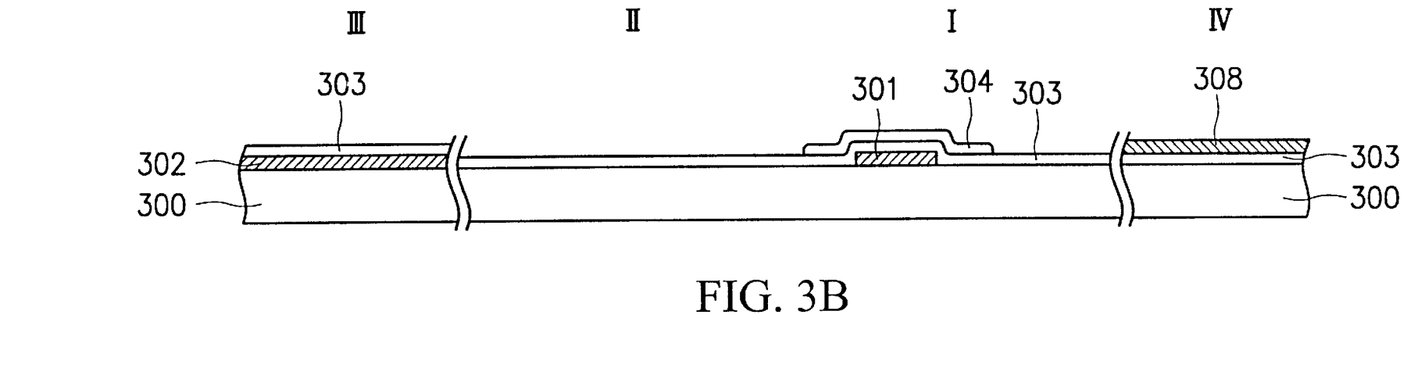

Form a first isolation 303 over the substrate 300. Next, form an active layer on the first isolation layer 303. The active layer is an amorphous silicon layer or a polysilicon layer.

Carry out the second photolithography process (using the second mask) to pattern and etch the active layer, thereby forming an island-like layer 304 over the gate layer 301, as depicted in FIG. 3B.

Figure 3C:
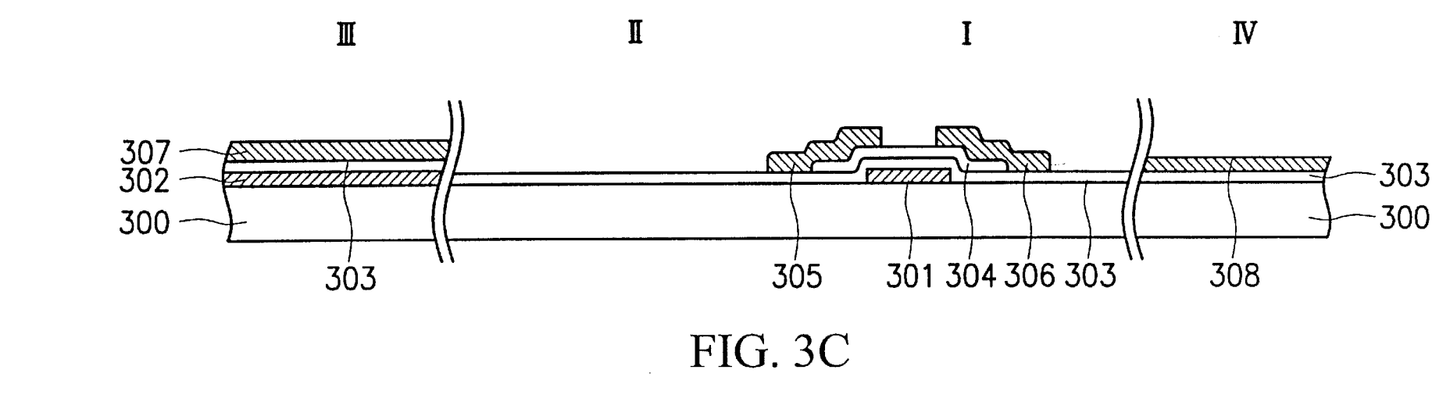

Further, form a second conduction layer, for example a second metal layer (metal-2), over the substrate 300.

Although the first and second conduction layers are metal layers in this embodiment, they also can be polysilicon layers.

Carry out the third photolithography process (using the third mask) to pattern and etch the second metal layer (metal-2), thereby forming a first source/drain electrode 305, a second source/drain electrode 306, a top electrode layer 307, and a common contact layer 308, as depicted in FIG. 3C.

It is noted that the first and second source/drain electrodes (305, 306) respectively overlap side portions of the island-like layer 304. The island-like layer 304, serving as the channel region of the TFT 201 (FIG. 2), is revealed between the first and second source/drain electrodes (305 and 306). The bottom electrode layer 302, the top electrode layer 307, and the first isolation layer 303 constitute a storage capacitor of the pixel unit in the LCD panel.

Figure 3D:
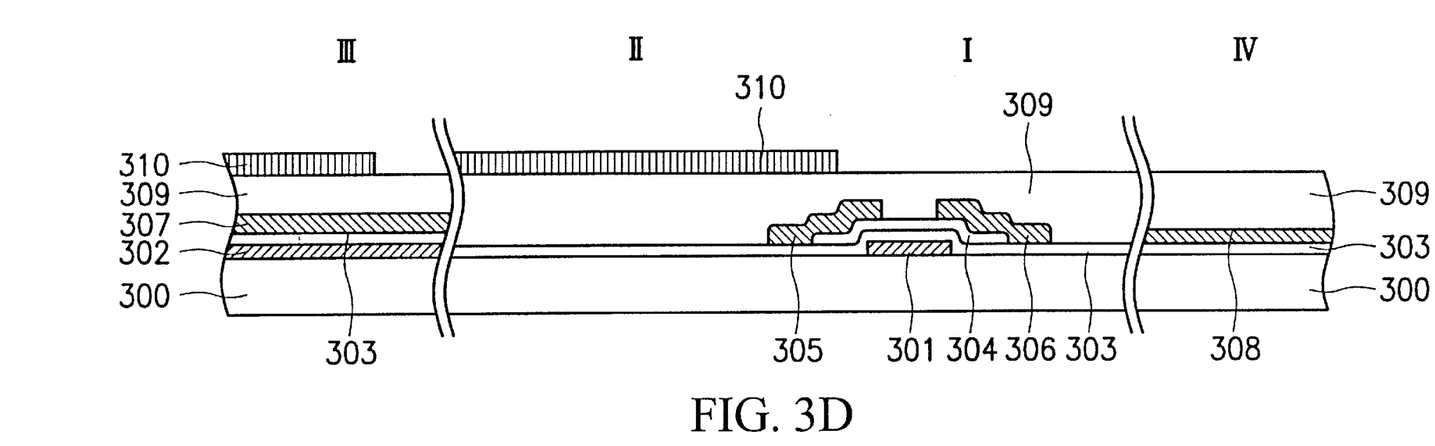

Subsequently, form a second isolation layer 309 over the substrate 300. Form a third conduction layer, for example a first ITO layer (ITO1), on the second isolation layer 309.

Carry out the fourth photolithography process (using the fourth mask) to pattern and etch the first ITO layer (ITO1), thereby forming a common electrode layer 310, as depicted in FIG. 3D.

Figure 3E:
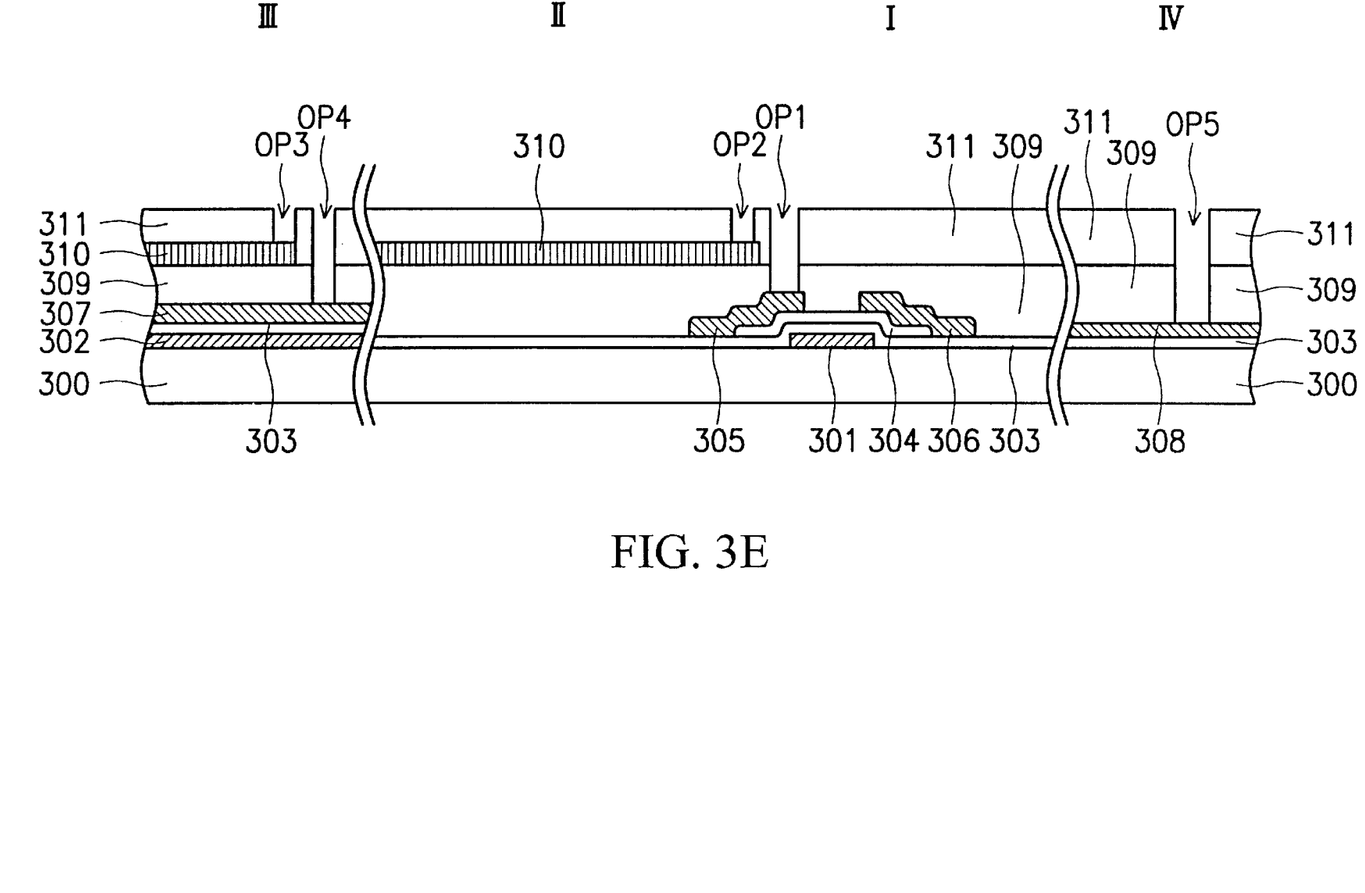

Further, form a third isolation layer 311 over the substrate 300.

Then, carry out the fifth photolithography process (using the fifth mask) to pattern and etch the third and second isolation layers (311 and 309), thereby forming a first opening (or contact hole)(OP1), a second opening (OP2), a third opening (OP3), a fourth opening (OP4), and at least a fifth opening (OP5), as depicted in FIG. 3E.

It is noted that the first source/drain electrode 305 is revealed in the first opening (OP1), the common electrode layer 310 is revealed in the second and third openings (OP2 and OP3), the top electrode layer 307 is revealed in the fourth opening (OP4), and the common contact layer 308 is revealed in the fifth opening (OP5).

Figure 3F:
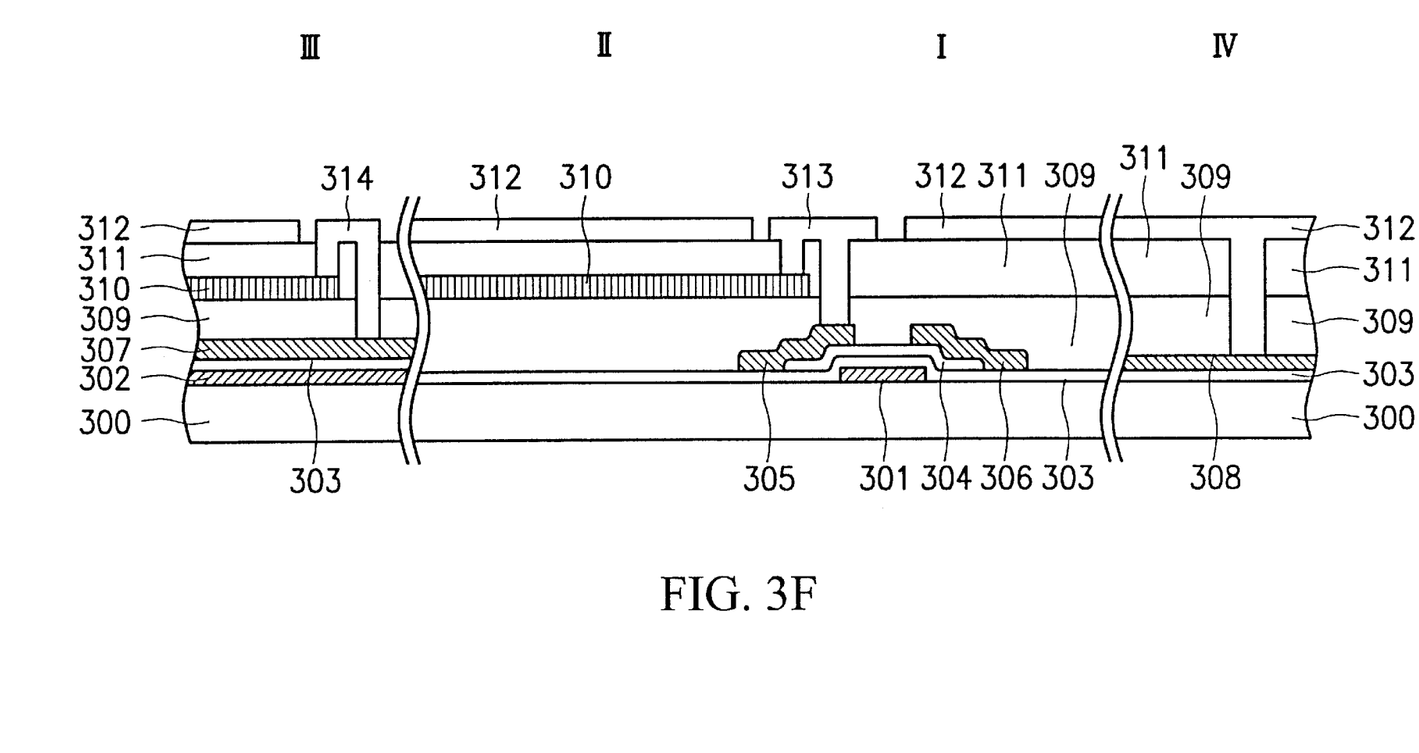

Subsequently, form a fourth conduction layer, for example a second ITO layer (ITO2), on the isolation layer 311, wherein the second ITO layer (ITO2) fills into the first to fifth openings.(OP1~OP5).

Further, carry out the sixth photolithography process (using the sixth mask) to pattern and etch the second ITO layer (ITO2), thereby forming a plurality of pixel electrodes 312, a first connecting layer 313, and a second connecting layer 314 on the third isolation layer 311, as depicted in FIG. 3F.

It is noted that the first source/drain electrode 305 in the first opening OP1 and the common electrode layer 310 in the second opening OP2 are electrically connected via the first connecting layer 313. The common electrode layer 310 in the third opening Op3 and the top electrode layer 307 in the fourth opening OP4 are electrically connected via the second connecting layer 314. The pixel electrodes 312 electrically connect to the common contact layer 308 through the fifth opening OP5.

From the above descriptions, the features of the present invention are quite clear. After forming the second isolation layer 309, no step of forming contact holes (or openings) is immediately carried out, according to the present invention. Instead, the required openings or contact holes (OP1~OP5) are formed together after forming the third isolation layer 311 and the required circuitry is formed by defining the second ITO layer (ITO2) at the non-pixel and opaque region thereof, whereby only six masks are required to manufacture the pixel unit of the LCD panel and the cost is reduced.

While the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method of manufacturing a displaying unit of a flat display panel having a wide view angle, comprising the steps of:

forming a first conduction layer on a substrate;

patterning and etching the first conduction layer to form a gate layer and a bottom electrode layer on the substrate;

forming a first isolation layer on the substrate;

forming an active layer on the first isolation;

patterning and etching the active layer to form an island-like layer over the gate layer;

forming a second conduction layer over the substrate;

patterning and etching the second conduction layer to form a first and a second source/drain electrodes, a top electrode layer, and a common contact layer; wherein Lithe first and second source/drain electrodes respectively overlap the two side portions of the island-like layer revealing the island-like layer therebetween, and the bottom electrode layer, the first isolation layer, and the top electrode layer constitute a storage capacitor of the displaying unit of the flat display panel;

forming a second isolation layer over the substrate;

forming a third conduction layer on the second isolation layer;

patterning and etching the third and second isolation layers to form a first contact hole, a second contact hole, a third contact hole, a fourth contact hole, and at least a fifth contact hole; wherein the first source/drain electrode is revealed in the first contact hole, the common electrode layer is revealed in the second and third contact holes, the top electrode layer is revealed in the fourth contact hole, and the common contact layer is revealed in the fifth contact hole;

forming a fourth conduction layer on the third isolation layer and respectively filling into the first to fifth contact holes; and patterning and etching the fourth conduction layer to form a plurality of pixel electrodes, a first connecting layer, and a second connecting layer on the third isolation layer; wherein the first source/drain electrode in the first contact hole and the common electrode layer in the second contact hole are electrically connected via the first connecting layer, the common electrode layer in the third contact hole and the top electrode layer in the fourth contact hole are electrically connected via the second connecting layer, and the pixel electrodes electrically connect to the common contact layer through the fifth contact hole.

2. The method as claimed in claim 1, wherein the first and second conduction layers are metal layers.

3. The method as claimed in claim 1, wherein the third and fourth conduction layers are indium-tin oxide layers.

4. The method as claimed in claim 1, wherein the first and second conduction layers are polysilicon layers.

5. The method as claimed in claim 1, wherein the plural pixel electrodes are formed in the shape of a comb or fingers.

* * * * *